(12) United States Patent
Shibahara

(10) Patent No.: US 6,914,477 B2
(45) Date of Patent: Jul. 5, 2005

(54) BANDPASS FILTER UNIT AND COMMUNICATION APPARATUS

(75) Inventor: Teruhisa Shibahara, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 6 days.

(21) Appl. No.: 10/408,281

(22) Filed: Apr. 7, 2003

(65) Prior Publication Data

US 2003/0197578 A1 Oct. 23, 2003

(30) Foreign Application Priority Data

Apr. 17, 2002 (JP) ......................................... 2002-114935

(51) Int. Cl.⁷ ................................................ H03B 1/00
(52) U.S. Cl. ...................... 327/558; 327/552; 333/126; 333/167
(58) Field of Search ................................ 327/552–559; 333/187, 193, 167, 185, 126, 202

(56) References Cited

U.S. PATENT DOCUMENTS

| | | | |
|---|---|---|---|
| 3,737,813 A | * | 6/1973 | Buecherl .................... 333/167 |
| 5,294,898 A | | 3/1994 | Dworsky et al. |
| 5,721,518 A | * | 2/1998 | Hahn .......................... 333/167 |
| 5,815,052 A | * | 9/1998 | Nakajima et al. ........... 333/175 |
| 6,147,571 A | * | 11/2000 | Kitazawa et al. ........... 333/126 |
| 2002/0130729 A1 | * | 9/2002 | Larson et al. ............. 333/99 S |

OTHER PUBLICATIONS

"SAW Device Technique Handbook"; edited by the SAW Device Technique 150$^{th}$ Committee of the Japan Society for the Promotion of Science; Published by Ohm–sha, Ltd.; pp. 205–219.

\* cited by examiner

Primary Examiner—Dinh T. Le
(74) Attorney, Agent, or Firm—Keating & Bennett, LLP

(57) ABSTRACT

A bandpass filter unit includes first and second bandpass filters having substantially the same pass-band characteristics. The first and second bandpass filters are connected in parallel with each other. At least one phase shifter for shifting the phase is connected to at least one of the first and second filters. Accordingly, reflected waves occurring in the first and second bandpass filters cancel out each other at an input terminal pair and an output terminal pair.

21 Claims, 16 Drawing Sheets

EXAMPLE OF KNOWN FILTER

BANDPASS FILTER UNIT AND COMMUNICATION APPARATUS

BACKGROUND OF THE INVENTION

1. Field of the Invention

The present invention relates to bandpass filter units and communication apparatuses, and more particularly, to a bandpass filter unit that is configured to suppress reflected waves at input and output terminals.

2. Description of the Related Art

Bandpass filters have been used in transmission circuits or signal processing circuits in high frequency bands, such as microwave and millimetric wave bands. This type of bandpass filter includes, for example, surface acoustic wave (SAW) filters, dielectric filters, waveguide filters, microstrip line filters, and filters including lumped constant components having reactance (capacitors, chip inductors, air-core coils, etc.).

FIG. 12 is a schematic plan view illustrating a resonator SAW filter unit 500 as an example of known bandpass filters. In the resonator SAW filter unit 500, a resonator SAW filter 502 is provided on a piezoelectric monocrystal substrate 501. The resonator SAW filter 502 includes interdigital transducers (IDTs) 514, 515, and 516 arranged in a direction in which a SAW propagates, and reflectors 513 and 517 disposed in the SAW propagating direction such that they sandwich the IDTs 514, 515, and 516 therebetween.

An electrode pad 509 connected to a ground potential and an electrode pad 512, which defines an output terminal, are connected to the central IDT 515 via connecting conductors 504 and 507, respectively. An electrode pad 511, which defines an input terminal, is connected to one comb-like electrode of the IDT 514 and one comb-like electrode of the IDT 516 via connecting conductors 503 and 505, respectively. An electrode pad 510 connected to a ground potential is connected to the other comb-like electrodes of the IDTs 514 and 516 via connecting conductors 506 and 508, respectively.

As the resonator SAW filter unit 500, a bandpass filter having a characteristic impedance of 50Ω and a pass band of 1805 MHz to 1885 MHz is provided. Examples of the characteristics of this bandpass filter are shown in FIGS. 13 through 16. FIG. 13 illustrates a transmission characteristic; FIG. 14 illustrates the enlarged essential portion of the transmission characteristic shown in FIG. 13; FIG. 15 is a Smith chart illustrating an impedance characteristic of the input terminal of the resonator SAW filter unit 500 in the pass-band frequencies; and FIG. 16 is a Smith chart illustrating an impedance characteristic of the output terminal in the pass-band frequencies.

The principle of the operation of the resonator SAW filter unit 500 is described in, for example, "SAW Device Technique Handbook" (edited by the SAW Device Technique 150th Committee of the Japan Society for the Promotion of Science, and published by Ohm-sha, Ltd.).

In bandpass filters used in microwave or millimetric bands, perfect impedance matching is preferably provided at input and output terminals. That is, it is desirable that signals in the pass band do not reflect at input and output terminals. This is because loss may be caused in reflected signals in the pass band, and also, reflected waves may produce an adverse influence on electric circuits connected to the bandpass filters.

The above-described problem is more specifically explained below in the context of a bandpass filter disposed between an antenna and an amplifier in a receiver of a cellular telephone.

If impedance matching is not provided for pass-band signals at the input terminal of a bandpass filter, the portion of a pass-band signal received by the antenna is reflected at the input terminal of the bandpass filter, thereby causing loss in the received signal. In this case, to compensate for the loss in the received signal, the gain of the amplifier must be increased for ensuring necessary signal intensity, resulting in an increase in the power consumption of the cellular telephone.

Also, loss in a portion of the received signal decreases the signal-to-noise (S/N) ratio. Even if the signal level is increased by the amplifier at the subsequent stage, the S/N ratio is not recovered, thereby impairing the reception performance of the cellular telephone.

The portion of the received signal reflected at the input terminal of the bandpass filter is also reflected at the antenna terminal, and is returned to the bandpass filter. Accordingly, due to this multiple reflection, a received signal having a phase delay is superposed on the normal received signal in the bandpass filter. Thus, due to this multiple reflection, the level of the received signal is also decreased, and the reception performance of the cellular telephone is impaired.

As described above, the reflection of signals at the input terminal of the bandpass filter causes various adverse influences. It is thus demanded that the impedance matching be provided in the pass band so as to suppress the reflection of signals to a minimal level at the input terminal of the bandpass filter.

If the impedance matching is not provided in the pass band at the output terminal of the bandpass filter, multiple reflection occurs in the pass-band signals between the output terminal of the bandpass filter and the input terminal of the amplifier. Accordingly, the operation of the amplifier, which is designed to provide the gain for the pass-band signals, becomes unstable, and in the worst case, abnormal oscillation occurs. If the level of the impedance mismatching at the output terminal of the bandpass filter is not considerably high, abnormal oscillation does not occur. In this case, however, the multiple reflections occurring between the bandpass filter and the amplifier due to the impedance mismatching inhibit, more or less, the normal operation of the bandpass filter. It is thus desirable that the impedance matching be also provided at the output terminal of the bandpass filter so as to suppress the reflection of signals.

Generally, not only in this type of bandpass filter, but also in bandpass filters used in a microwave or millimetric wave band, it is desirable that the perfect impedance matching be provided at input and output terminals in the entire frequency range of the pass band so as to suppress reflection of pass-band signals at the input and output terminals.

In reality, however, it is practically impossible to provide perfect impedance matching for the input and output terminals in the entire frequency range of the pass band because the input/output impedances of the bandpass filters have frequency characteristic. It is thus important that almost perfect impedance matching be provided in the entire frequency range of the pass band.

The impedance characteristics at the input and output terminals of the known resonator SAW filter unit 500 indicate, as shown in FIGS. 15 and 16, that the perfect impedance matching is not provided although the impedance is positioned close to the perfect matching point, which is the center of the Smith chart. That is, the impedance characteristic moves around the perfect matching point while exhibiting frequency characteristic. Accordingly, the reflection of the signals occurs at the input and output terminals in accordance with the distance of the input/output impedances to the perfect matching point.

SUMMARY OF THE INVENTION

In order to overcome the problems described above, preferred embodiments of the present invention provide a bandpass filter unit having an improved impedance matching characteristic in the entire frequency range of a pass band.

According to a first preferred embodiment of the present invention, a bandpass filter unit includes a first filter, a second filter having a characteristic with respect to the frequency at least in a frequency band for use that is substantially the same as the characteristic of the first filter, the second filter being connected in parallel with the first filter, a first phase shift unit for shifting the phase by x degrees being cascade-connected to the input terminal of the first filter at a stage after parallel connecting points of the input terminals of the first filter and the second filter, a second phase shift unit for shifting the phase by y degrees being cascade-connected to the output terminal of the first filter at a stage before parallel connecting points of the output terminals of the first filter and the second filter, a third phase shift unit for shifting the phase by z degrees being cascade-connected to the input terminal of the second filter at a stage after the parallel connecting points of the input terminals of the first filter and the second filter, and a fourth phase shift unit for shifting the phase by w degrees being cascade-connected to the output terminal of the second filter at a stage before the parallel connecting points of the output terminals of the first filter and the second filter. The variables x, y, z, and w substantially satisfy the conditions expressed by equations (1) through (3):

$$2x-2z=180+n\times 360 \ (n \text{ is a certain integer}); \quad (1)$$

$$2y-2w=180+m\times 360 \ (m \text{ is a certain integer}); \quad (2) \text{ and}$$

$$x+y=z+w+l\times 360 \ (l \text{ is a certain integer}). \quad (3)$$

According to a second preferred embodiment of the present invention, a bandpass filter unit includes a first filter, a second filter having a characteristic with respect to the frequency at least in a frequency band for use that is substantially the same as the characteristic of the first filter, the second filter being connected in parallel with the first filter, a phase shift unit for shifting the phase by substantially (90+n×180) degrees (n is a certain integer) being cascade-connected to the output terminal of the first filter at a stage before parallel connecting points of the output terminals of the first filter and the second filter, and a phase shift unit for shifting the phase by substantially (90+m×180) degrees (m is a certain integer, which is an odd number when n is an odd number or is an even number when n is an even number) being cascade-connected to the input terminal of the second filter at a stage after parallel connecting points of the input terminals of the first filter and the second filter.

According to a third preferred embodiment of the present invention, a bandpass filter unit includes a first filter, a second filter having a characteristic with respect to the frequency at least in a frequency band for use that is substantially the same as the characteristic of the first filter, the second filter being connected in parallel with the first filter, a phase shift unit for shifting the phase by substantially (90+n×180) degrees (n is a certain integer) being cascade-connected to the input terminal of the first filter at a stage after parallel connecting points of the input terminals of the first filter and the second filter, and a phase shift unit for shifting the phase by substantially (90+m×180) degrees (m is a certain integer, which is an odd number when n is an odd number or is an even number when n is an even number) being cascade-connected to the output terminal of the first filter at a stage before parallel connecting points of the output terminals of the first filter and the second filter.

With the above-described configuration, the reflected waves occurring in the first filter and the second filter cancel each other out, thereby preventing the occurrence of reflected waves at the input/output terminals. Accordingly, the reflection of pass-band signals at the input/output terminals is greatly reduced. It is thus possible to provide a bandpass filter unit providing excellent impedance matching at the input terminal. Additionally, since the reflection of pass-band signals can be reduced, the transmission efficiency of the pass-band signals is greatly improved.

In preferred embodiments of the present invention, the above-described phase shift unit may preferably include known phase shift devices, for example, wiring forming the bandpass filter unit, as long as they are configured to shift the phase.

According to a specific preferred embodiment of the present invention, at least one of the phase shift unit may be a delay line. The delay line can be easily formed on a circuit substrate or a piezoelectric substrate of the bandpass filter unit. With this arrangement, the phase shift unit can be easily formed.

According to another specific preferred embodiment of the present invention, at least one of the phase shift units may include a capacitor device and an inductor device. In this case, by selecting the characteristics of the capacitor device and the inductor device, an optimal phase shift unit can be easily provided.

The first filter and the second filter may include various types of bandpass filters, such as SAW filters, dielectric filters, and piezoelectric filters.

According to still another specific preferred embodiment of the present invention, the first filter and the second filter may be SAW filters provided with a piezoelectric substrate, and the delay line may be defined by a conductor strip line disposed on the piezoelectric substrate. In this case, the delay line can be easily formed simply by forming a conductor strip line on the piezoelectric substrate forming the SAW filter. Also, the delay line can be formed integrally with the SAW filter, thereby reducing the size of the bandpass filter unit.

According to a further specific preferred embodiment of the present invention, the first filter and the second filter may be SAW filters provided with a piezoelectric substrate, and at least one of the phase shift unit may be defined by a capacitor device and an inductor device, the capacitor device including an opposing electrode mounted on the piezoelectric substrate. In this case, the capacitor device can be easily formed by disposing an opposing electrode on the piezoelectric substrate of the SAW filter. Thus, the capacitor device can be easily formed without increasing the size of the bandpass filter unit.

A communication apparatus of another preferred embodiment of the present invention includes the bandpass filter unit configured in accordance with the above-described preferred embodiments of the present invention as a bandpass filter.

Other features, elements, characteristics and advantages of the present invention will become more apparent from the following detailed description of preferred embodiments with reference to the attached drawings.

DETAILED DESCRIPTION OF PREFERRED EMBODIMENTS

The present invention is described in detail below with reference to the accompanying drawings through illustration of preferred embodiments thereof.

Figure 1:
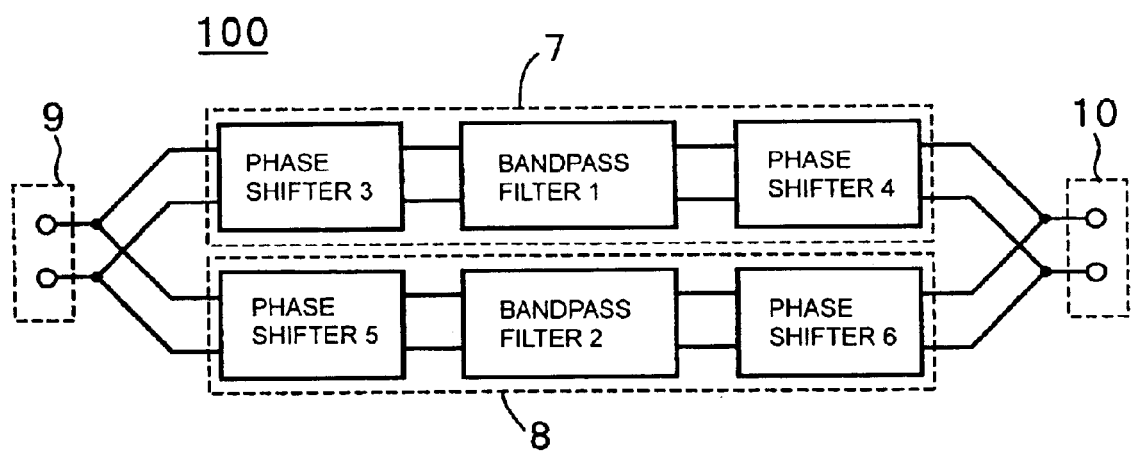
FIG. 1 illustrates the circuit configuration of a bandpass filter unit according to a first preferred embodiment of the present invention.

FIG. 1 is a circuit diagram illustrating the schematic configuration of a bandpass filter unit 100 according to a first preferred embodiment of the present invention.

In the bandpass filter unit 100, a first bandpass filter 1 and a second bandpass filter 2 having substantially the same characteristics in the pass band are used. That is, the first and second bandpass filters 1 and 2 having substantially the same input/output impedance characteristics and transmission characteristics with respect to the frequency are connected in parallel with each other between an input terminal pair 9 and an output terminal pair 10.

A phase shifter 3, which defines a first phase shift unit, for shifting the phase of a signal by x° is cascade-connected between the input terminal pair 9 and the first bandpass filter 1. A phase shifter 4, which defines a second phase shift unit, for shifting the phase of a signal by y° is cascade-connected between the bandpass filter 1 and the output terminal pair 10. Similarly, a phase shifter 5, which defines a third phase shift unit, for shifting the phase of a signal by z° is cascade-connected between the input terminal pair 9 and the second bandpass filter 2, and a phase shifter 6, which defines a fourth phase shift unit, for shifting the phase of a signal by w° is cascade-connected between the bandpass filter 2 and the output terminal pair 10.

In other words, a filter circuit 7 defined by sequentially cascade-connecting the phase shifter 3, the first bandpass filter 1, and the phase shifter 4 is connected in parallel with a filter circuit 8 defined by sequentially cascade-connecting the phase shifter 5, the second bandpass filter 2, and the phase shifter 6.

By connecting the filter circuits 7 and 8 in parallel with each other, the bandpass filter unit 100 is produced. It should be noted that the input terminal pair 9 and the output terminal pair 10 are connected to the parallel connecting points of the above-described parallel connection.

In the first preferred embodiment, the following equations (1) through (3) substantially hold true for the relationships among the amounts x, y, z, and w by which the phase is shifted (hereinafter referred to as "phase-shift amounts x, y, z, and w" of the phase shifters 3, 4, 5, and 6, respectively). It should be noted that the relationships among the phase-shift amounts x, y, z, and w do not precisely satisfy equations (1) through (3), and include ranges of about ±30% of equations (1) through (3). Within these ranges, almost perfect impedance matching can be provided at the input and output terminals, as discussed below.

$$2x-2z=180°+n\times 360° \quad (n \text{ is a certain integer}) \quad (1)$$

$$2y-2w=180°+m\times 360° \quad (m \text{ is a certain integer}) \quad (2)$$

$$x+y=z+w+i\times 360° \quad (i \text{ is a certain integer}) \quad (3)$$

The operation of the bandpass filter unit 100 and the provision of the impedance matching at the input and output terminals are described below.

The reflection of pass-band signals occurring at the input terminal pair 9 is first discussed. Reflected waves at the input terminal pair 9 are synthesized from reflected waves occurring in the filter circuit 7 and those in the filter circuit 8. Without the phase shifters 3 and 5 connected to the first and second bandpass filters 1 and 2, respectively, the reflected waves occurring in the filter circuit 7 would be substantially in phase with and substantially have the same amplitude as those in the filter circuit 8 since the band characteristics of the first bandpass filter 1 are substantially equal to those of the second bandpass filter 2.

With the phase shifters 3, however, the reflected waves occurring in the filter circuit 7 pass through the phase shifter 3 twice when advancing toward the first bandpass filter 1 and when returning to the input terminal pair 9 by being reflected at the input terminal of the first bandpass filter 1. Accordingly, in the filter circuit 7 provided with the phase shifter 3, the phase of the reflected waves is delayed by 2x° compared to the filter circuit 7 without the phase shifter 3.

Similarly, in the filter circuit 8 provided with the phase shifter 5, the phase of the reflected waves occurring in the filter circuit 8 is delayed by 2z° compared to the filter circuit 8 without the phase shifter 5.

Accordingly, even though the reflected waves occurring in the filter circuit 7 have substantially the same amplitude as those in the filter circuit 8, a phase difference of $2(x-z)°$ is generated between the reflected waves of the filter circuit 7 and those of the filter circuit 8.

Accordingly, equation (1) signifies that the phase of the reflected waves occurring in the filter circuit 7 is inverted from those in the filter circuit 8. That is, the reflected waves occurring in the filter circuit 7 and those in the filter circuit 8 are substantially 180° out of phase with each other and have substantially the same amplitude. Accordingly, the reflected waves occurring in the filter circuit 7 and those in the filter circuit 8 cancel each other out, and thus, the occurrence of reflected waves at the input terminal pair 9 can be suppressed and prevented.

The occurrence of reflected waves can be suppressed and prevented as long as the frequency of an input signal is within the pass band. In the bandpass filter unit 100 of the first preferred embodiment, therefore, the occurrence of reflected waves at the input terminal can be suppressed over the entire frequency range of the pass band. It is thus possible to provide a bandpass filter that exhibits an excellent impedance matching characteristic at the input terminal.

Also at the output terminal, the reflected waves occurring in the filter circuit 7 and those in the filter circuit 8 cancel each other out. That is, the characteristics of the bandpass filter 1 and those of the bandpass filter 2 in the pass band are almost the same as each other, and the relationship between the phase-shift amount y of the phase shifter 4 and the phase-shift amount w of the phase shifter 6 substantially satisfies equation (2). Accordingly, the reflected waves occurring in the filter circuit 7 and those in the filter circuit 8 cancel each other out, and thus, the occurrence of reflected waves at the output terminal pair 10 can also be substantially prevented in the entire frequency range of the pass band.

As discussed above, in the bandpass filter unit 100 of the first preferred embodiment, the reflection at the input terminal and the output terminal can be suppressed and prevented. It is thus possible to provide a bandpass filter unit that exhibits an excellent impedance matching characteristic at input and output terminals.

The pass-band transmission characteristics of the bandpass filter unit 100 are as follows.

Traveling waves passing through the bandpass filter unit 100 are synthesized from traveling waves passing through the filter circuit 7 and those passing through the filter circuit 8. The phase shifters 3 and 4 produce a phase shift of $(x+y)°$ for the traveling waves passing through the filter circuit 7. The phase shifters 5 and 6 produce a phase shift of $(z+w)°$ for the traveling waves passing through the filter circuit 8. The difference of the phase-shift amount between the filter circuit 7 and the filter circuit 8 is an integral multiple of 360° from equation (3).

That is, the phase of the traveling waves passing through the filter circuit 7 and the phase of the traveling waves passing through the filter circuit 8 are almost the same as those when the phase shifters 3 through 6 are not provided.

Without the phase shifters 3 through 6, the traveling waves passing through the filter circuit 7 are exactly the same as those passing through the first bandpass filter 1, and the traveling waves passing through the filter circuit 8 are exactly the same as those passing through the second bandpass filter 2. Since the band characteristics of the first bandpass filter 1 and those of the second bandpass filter 2 are substantially the same, the traveling waves of the first and second bandpass filters 1 and 2 are substantially in phase with each other.

The phase relationship between the traveling waves passing through the filter circuit 7 and those passing through the filter circuit 8 is almost the same as that between the bandpass filter unit 100 provided with the phase shifters 3 through 6 and a bandpass filter unit without the phase shifters 3 through 6. Accordingly, with the phase shifters 3 through 6, the traveling waves passing through the filter circuit 7 become almost in phase with those passing through the filter circuit 8.

Accordingly, the traveling waves passing through the filter circuit 7 and those passing through the filter circuit 8 are efficiently superposed on each other while being substantially in phase so as to synthesize the traveling waves output from the bandpass filter unit 100.

Therefore, the signal transmission efficiency of the overall bandpass filter unit 100 is substantially similar to that of each of the first and second bandpass filters 1 and 2.

In practice, since the loss caused by reflection is considerably reduced, the transmission efficiency of the bandpass filter unit 100 is slightly improved over that of the first and second bandpass filters 1 and 2.

Even if the band characteristics of the first and second bandpass filters 1 and 2 are exactly the same, the first and second bandpass filters 1 and 2 do not necessarily exhibit exactly the same reflection characteristics in the bandpass filter unit 100. If the terminal conditions at the output terminals of the first bandpass filter 1 and those of the second bandpass filter 2 are exactly the same, the reflection characteristics of the input terminals of both the filters 1 and 2 become exactly the same. If the terminal conditions of the input terminals of the first bandpass filter 1 and those of the second bandpass filter 2 are exactly the same, the reflection characteristics of the output terminals of both the filters 1 and 2 become exactly the same. However, if such conditions are not satisfied, the state of multiple reflection occurring in the first bandpass filter 1 and that in the second bandpass filter 2 become slightly different from each other, and the reflection characteristics accordingly become slightly different between the first and second bandpass filters 1 and 2.

In the bandpass filter unit 100, since the input and output terminals of the first bandpass filter 1 are not in the same state as those of the second bandpass filter 2, the reflection characteristics become slightly different between the first and second bandpass filters 1 and 2 due to an influence of the multiple reflection in the bandpass filters 1 and 2. Accordingly, the reflected waves occurring in the filter circuit 7 do not completely cancel out the reflected waves in the filter circuit 8, thereby causing a small amount of reflected waves in the overall bandpass filter unit 100.

However, by using filters that cause considerably a small amount of reflection in the pass band as the first and second bandpass filters 1 and 2, the multiple reflection in the filters in the pass band becomes very small. Accordingly, the reflected waves in the filter circuit 7 almost cancel out the reflected waves in the filter circuit 8. Thus, the bandpass filter unit 100 exhibits a much smaller amount of reflection in the pass band than the single use of the first or second bandpass filter 1 or 2. Further advantages are described below by using a specific example.

In the present invention, it is not essential that the conditions expressed by equations (1) through (3) be precisely satisfied.

That is, the advantages of the present invention can be obtained as long as $2x-2z$, $2y-2w$, and $x+y$ in equations (1), (2), and (3) are within a range of approximately ±30% of $180°+n\times360°$, $180°+m\times360°$, and $z+w+i\times360°$, respectively.

In equation (1), if y is substantially $(90°+n\times180°)$ (n is a certain integer), and z is substantially $(90°+m\times180°)$ (m is a certain integer, which should be an odd number if n is an odd number and should be an even number if n is an even number), equations (1) and (2) hold true even if x and w are set to be 0. That is, the phase shifters 3 and 6 may be omitted, as shown in a modified example of FIG. 2. In this case, by setting the phase-shift amount y of the phase shifter 4 to be substantially $(90°+n\times180°)$ and the phase-shift amount z of the phase shifter 5 to be substantially $(90°+m\times180°)$, advantages similar to those achieved by the first preferred embodiment can be obtained.

In equations (1) through (3), x may be set to be substantially $(90°+n\times180°)$ and y may be set to be substantially $(90°+m\times180°)$ (m is a certain integer, which should be an odd number if n is an odd number and should be an even number if n is an even number), and z and w may be set to be 0. In this case, only the phase shifters 3 and 4 are used, as in a modified example shown in FIG. 3, and phase shifters are not connected to the second bandpass filter 2.

Figure 2:
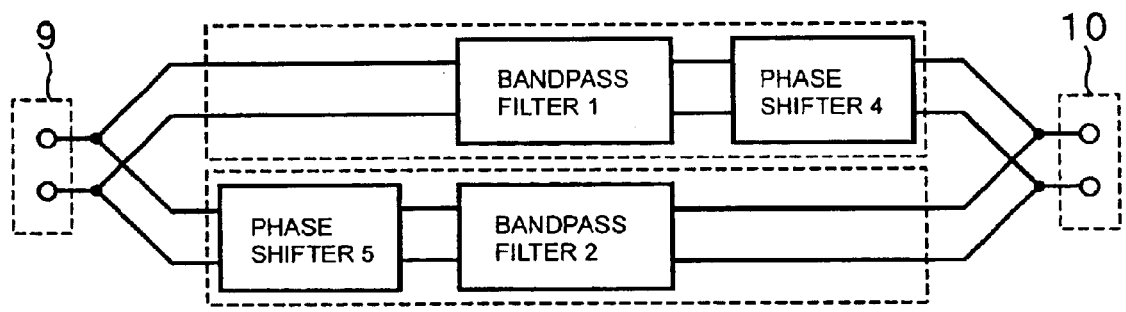
FIG. 2 is a circuit diagram illustrating a modified example of the bandpass filter unit shown in FIG. 1.
Figure 3:
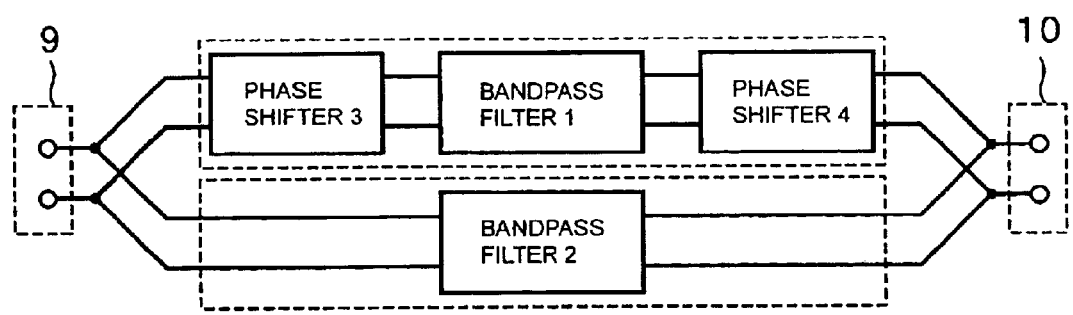
FIG. 3 is a circuit diagram illustrating another modified example of the bandpass filter unit shown in FIG. 1.

In the modified examples shown in FIGS. 2 and 3, only two phase shifters are used, and thus, the circuit can be simplified compared to the bandpass filter unit 100 shown in FIG. 1.

In the modified example shown in FIG. 2, the phase-shift amount y of the phase shifter 4 is set to be substantially $(90°+n\times180°)$, and the phase-shift amount z of the phase shifter 5 is set to be substantially $(90°+m\times180°)$, and in the modified example shown in FIG. 3, the phase-shift amount x of the phase shifter 3 is set to be substantially $(90°+n\times180°)$, and the phase-shift amount y of the phase shifter 4 is set to be substantially $(90°+m\times180°)$. The term "substantially" in this application means that a range of about ±30% is allowed In the present invention, the specific configuration of the phase shift unit is not particularly restricted, and various known phase shifters can be used. For example, phase shifters may include delay lines, which are preferably formed of conductor strip lines, on a dielectric substrate. Delay lines formed of conductor strip lines have a simple structure and can be manufactured at low cost.

The phase shifters may include capacitor devices and inductor devices connected in series with the capacitor devices. As the capacitor devices and the inductor devices, small devices that can be used in a microwave or millimetric wave band are commercially available. The inductor devices and capacitor devices may be formed on a SAW substrate according to a thin-film microprocessing technique so as to form small phase shifters, thereby reducing the size of the overall bandpass filter unit of various preferred embodiments of the present invention.

The phase shift units of the present invention do not have to be formed of the above-described known phase shifters, and may be formed of wiring, a conductive pattern or bonding wire.

The bandpass filter unit of preferred embodiments of the present invention includes first and second bandpass filters, which may increase the size of the overall bandpass filter unit. However, by using small SAW filters as the first and second bandpass filters, SAW filter electrodes can be formed on a piezoelectric substrate according to an ultra-microprocessing technique. It is thus possible to provide a bandpass filter unit of preferred embodiments of the present invention without significantly increasing the overall size.

Preferably, therefore, SAW filters are used as the bandpass filters 1 and 2. As the SAW filters, resonator SAW filters, transversal SAW filters, or SAW filters including a combination of a plurality of one-terminal-pair SAW resonators defining a ladder or lattice circuit may be used.

Nowadays, SAW filters including a combination of resonator SAW filters and one-terminal-pair SAW resonators are used as bandpass filters in cellular telephones. Such SAW filters may be used as the first and second bandpass filters 1 and 2.

When the first and second bandpass filters 1 and 2 are defined by SAW filters, they can be disposed on the same piezoelectric substrate, and also, phase shifters are defined by conductor strip lines. It is thus possible to further reduce the size of the bandpass filter unit of preferred embodiments of the present invention.

When the first and second bandpass filters 1 and 2 are defined by SAW filters, opposing electrodes are disposed on the same piezoelectric substrate on which the first and second bandpass filters 1 and 2 are disposed so as to define capacitor devices, which can be used as a portion of components forming the phase shifters. Accordingly, the size of the bandpass filter unit can also be reduced.

A specific example of preferred embodiments of the present invention is as follows.

Figure 12:
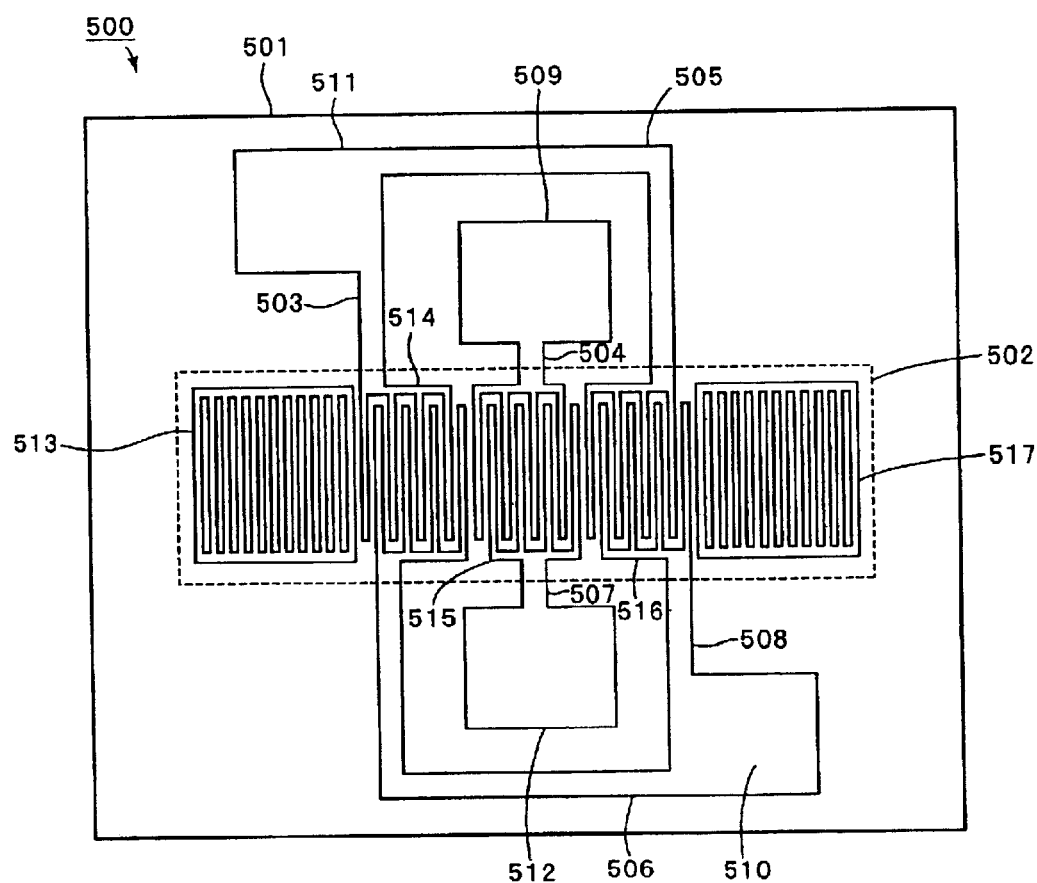
FIG. 12 is a schematic plan view illustrating a known resonator SAW filter unit.
Figure 13:
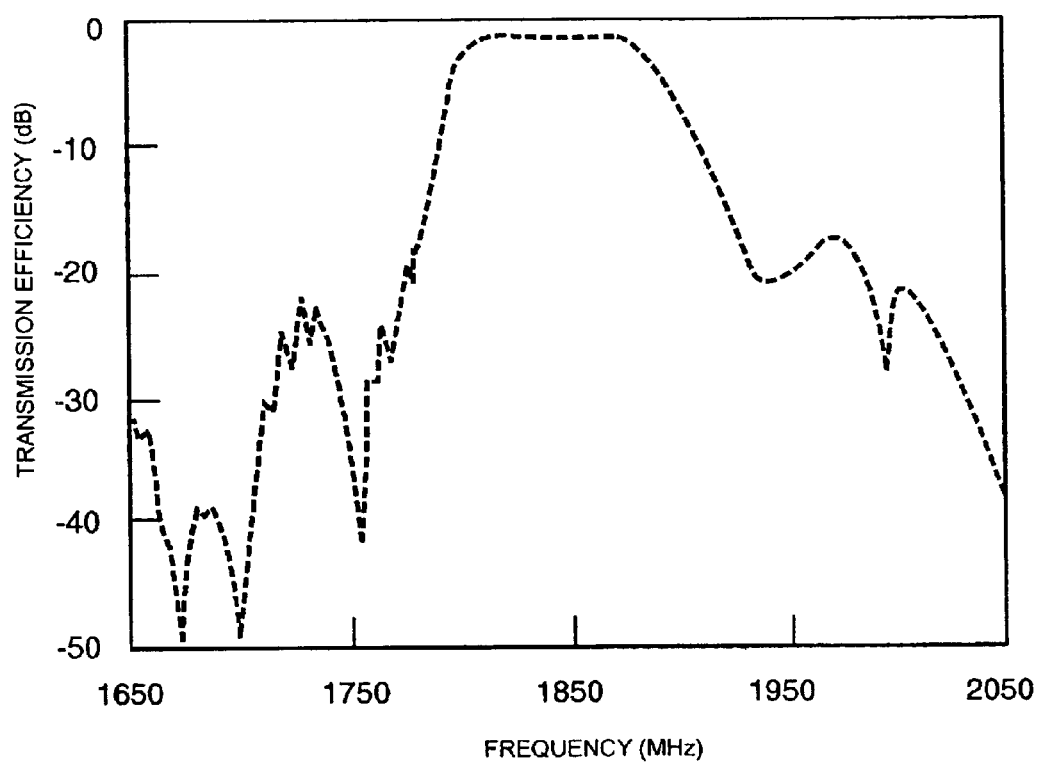
FIG. 13 illustrates the transmission efficiency with respect to the frequency of the known resonator SAW filter unit shown in FIG. 12.
Figure 14:
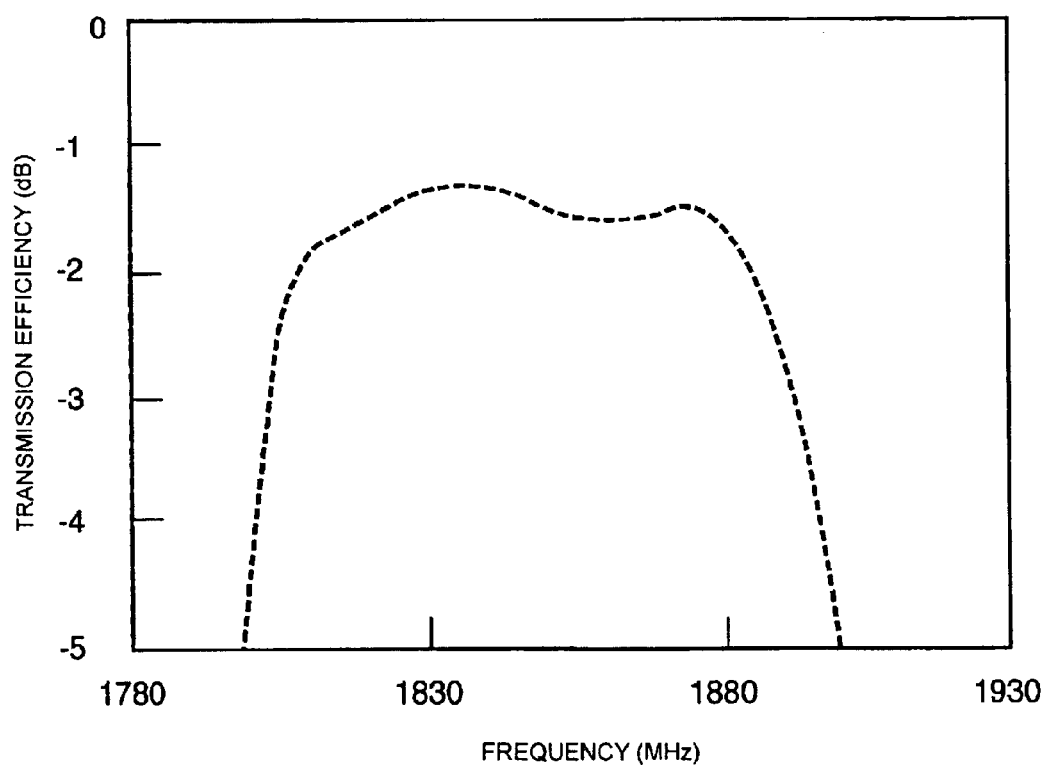
FIG. 14 illustrates an enlarged essential portion of the transmission efficiency shown in FIG. 13.
Figure 15:
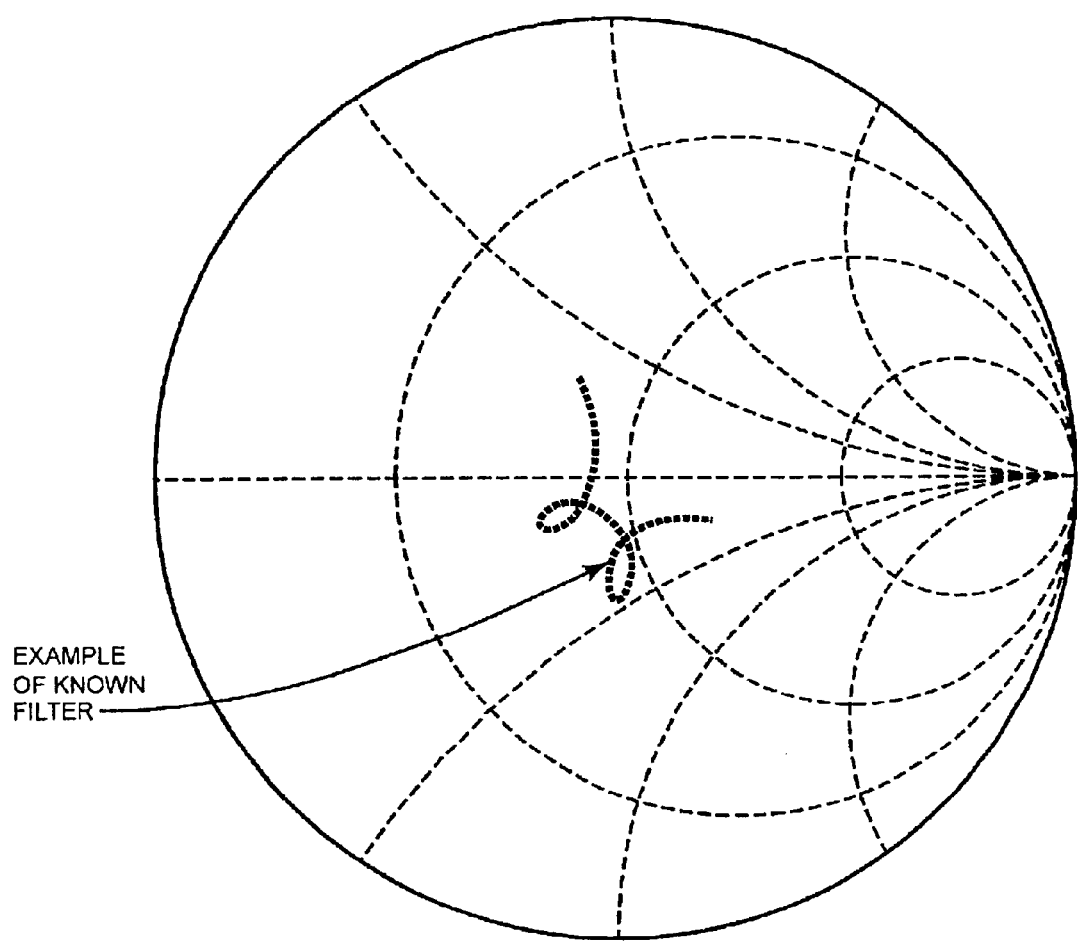
FIG. 15 illustrates a pass-band impedance characteristic at the input terminal of the known resonator SAW filter unit shown in FIG. 12.
Figure 16:
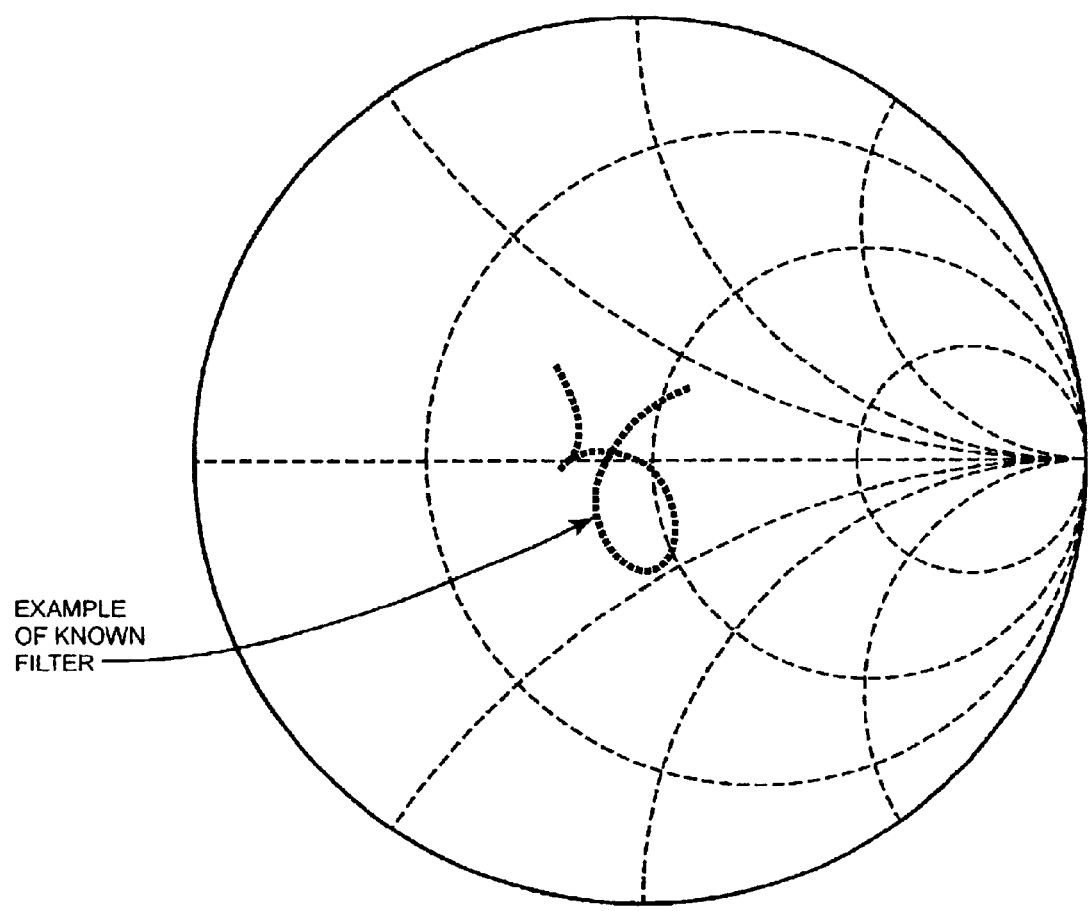
FIG. 16 illustrates a pass-band impedance characteristic at the output terminal of the known resonator SAW filter unit shown in FIG. 12.

In the following example, the resonator SAW filter unit 500 shown in FIG. 12 was prepared as a comparative example. Details are as follows. A 40±5° rotating Y-cut and X-propagating $LiTaO_3$ substrate was preferably used as the piezoelectric substrate 501. The electrode patterns on the piezoelectric substrate 501 were formed by Al thin film having a thickness of about 210 nm. The IDTs 514 and 516 were each formed of 12 pairs of opposing electrode fingers, and the line width and the pitch of the electrode fingers were about 0.68 µm and about 1.08 µm, respectively. However, concerning a pair of electrode fingers of each of the IDTs 514 and 516 positioned adjacent to the IDT 515, the line width and the pitch of the electrode fingers were about 0.58 µm and about 0.97 µm, respectively. The IDT 515 was formed of 18.5 pairs of opposing electrode fingers, and the line width and the pitch of the electrode fingers were about 0.68 µm and about 1.08 µm, respectively. However, for a pair of the outermost electrode fingers of the IDT 515, the line width and the pitch of the electrode fingers were about 0.58 µm and about 0.97 µm, respectively.

As the reflectors 513 and 517, grating reflectors, each having 150 electrode fingers, both ends being short-circuited, were used. The line width and the pitch of the electrode fingers were about 0.62 µm and about 1.09 µm, respectively.

The center-to-center distance of the electrode fingers between the reflector 513 and the IDT 514 was about 1.09 µm; the center-to-center distance between the IDT 514 and the IDT 515 was about 0.97 µm; the center-to-center distance between the IDT 515 and the IDT 516 was about 0.97 µm; and the center-to-center distance between the IDT 516 and the reflector 517 was about 1.09 µm. The length by which the opposing electrode fingers face each other (hereinafter referred to as the "interdigital length") of the IDTs 514, 515, and 516 was about 200 µm.

The transmission characteristic and the impedance characteristics of the input and output terminals of the comparative example configured as described above are shown in FIGS. 13 through 16, and are also indicated by broken lines in FIGS. 6 through 9.

Figure 4:
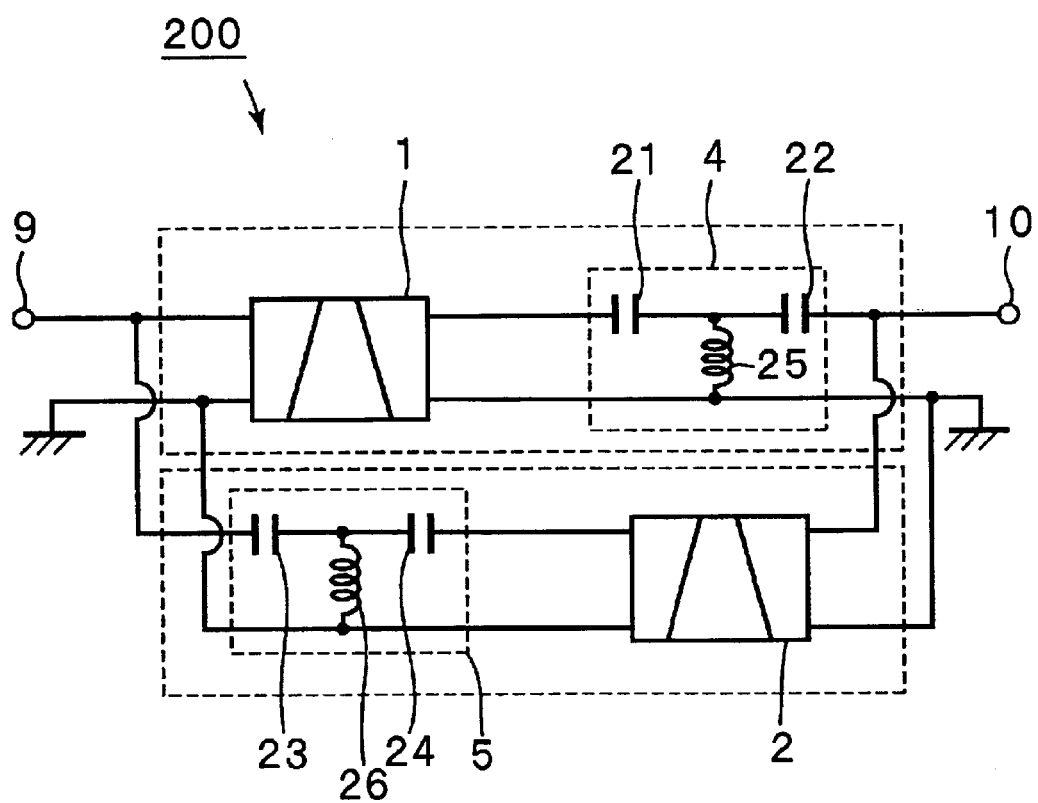
FIG. 4 is a circuit diagram illustrating a bandpass filter unit used in an example.
Figure 5:
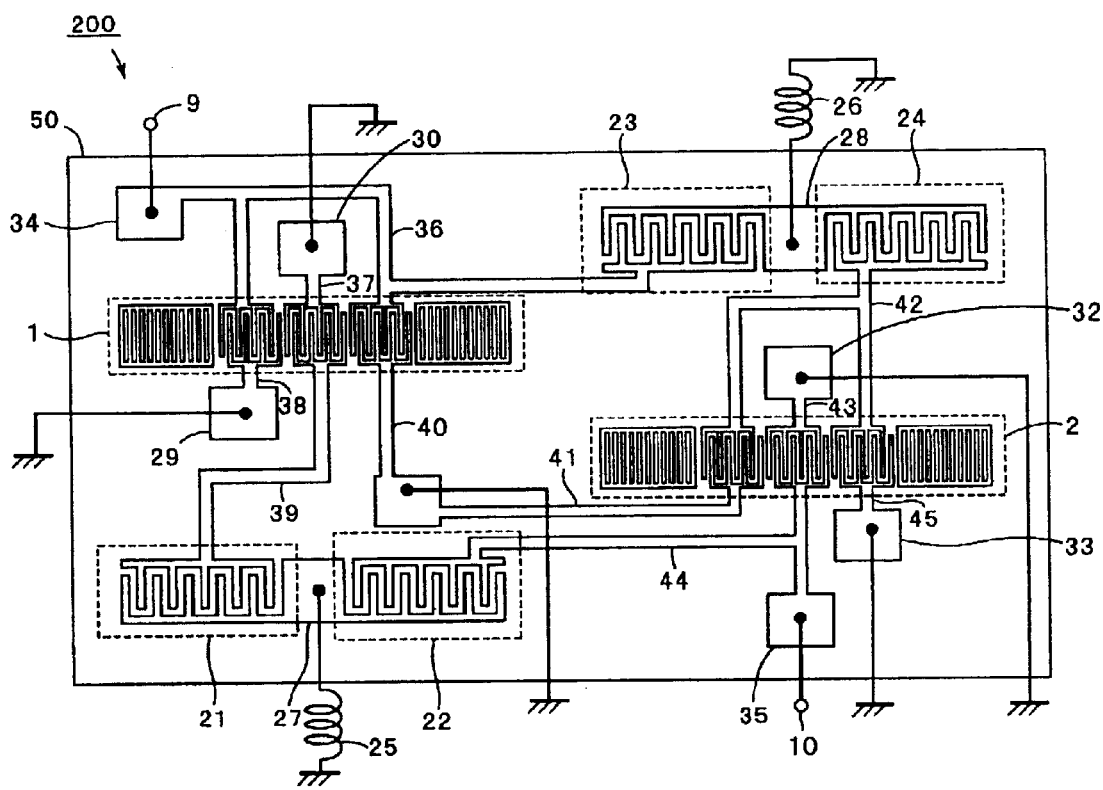
FIG. 5 is a schematic plan view illustrating the specific structure of the bandpass filter unit shown in FIG. 4.

In contrast to the comparative example, a bandpass filter unit 200 used in this example shown in FIGS. 4 and 5 was formed as follows. In the bandpass filter unit 200, first and second bandpass filters 1 and 2 were designed in a manner similar to the resonator SAW filter unit 500 of the above-described comparative example. As in the comparative example, a 40±5° rotating Y-cut and X-propagating $LiTaO_3$ substrate was used to form a piezoelectric substrate 50, and electrodes were formed by Al thin film having a thickness of about 210 nm. In the first and second bandpass filters 1 and 2, the interdigital length of the IDTs was about 100 μm. The reason for this is as follows. Since the two bandpass filters 1 and 2 are connected in parallel with each other, the impedance of each of the first and second bandpass filters 1 and 2 is preferably about 100Ω, which is twice higher than that of the resonator SAW filter unit 500, so that the impedance of the overall bandpass filter unit 200 becomes about 50Ω.

On the piezoelectric substrate 50, not only the first and second bandpass filters 1 and 2, capacitor devices 21 through 24, electrode pads 27 through 35, and connecting conductors 36 through 45 were disposed.

In this example, the capacitor devices 21 through 24 were each formed by allowing a pair of interdigital electrodes to interdigitate with each other. That is, a pair of opposing electrodes were disposed on the piezoelectric substrate 50 so as to form each of the capacitor devices 21 through 24. The width of each electrode finger of the capacitor devices 21 through 24 was about 1.11 μm, the spacing between opposing electrode fingers was about 1.11 μm, the interdigital length was about 20 μm, and the numbers of pairs of the electrode fingers of the capacitor devices 21 through 24 were 92, 87, 87, and 89.5, respectively.

The above-described piezoelectric substrate 50, a 10 nH chip inductor, which defines a coil device 25, and a 10 nH chip inductor, which defines a coil device 26, were mounted on a dielectric substrate (not shown).

By grounding one terminal of the coil device 25 and by electrically connecting the other terminal to the electrode pad 27 on the piezoelectric substrate 50, the coil device 25 was connected in series with the capacitor devices 21 and 22. By grounding one terminal of the coil device 26 and by electrically connecting the other terminal to the electrode pad 28 on the piezoelectric substrate 50, the coil device 26 was connected in series with the capacitor devices 23 and 24. The electrode pads 29 through 33 on the piezoelectric substrate 50 were connected to ground potentials. The electrode pad 34 was used as the input terminal, and the electrode pad 35 was used as the output terminal. According to the configuration described above, the circuit configuration shown in FIG. 4 was implemented so as to form the bandpass filter unit 200 having a pass band of 1805 MHz to 1885 MHz.

In the above-described example, the capacitor devices 21 through 24 each includes opposing electrodes formed by allowing a pair of comb-like electrodes to interdigitate with each other. The electrostatic capacitances of the capacitor devices 21 through 24 in the range of 1805 MHz to 1885 MHz are approximately 0.80 pF, 0.70 pF, 0.70 pF, and 0.78 pF, respectively. The capacitor devices 21 and 22, and the coil device 25 define the 90° phase shifter 4 having an overall characteristic impedance of about 100Ω in the range of 1805 MHz to 1885 MHz. The capacitor devices 23 and 24, and the coil device 26 define the 90° phase shifter 5 having a characteristic impedance of about 100Ω in the range of 1805 MHz to 1885 MHz.

As described above, the first and second bandpass filters 1 and 2 are resonator SAW filters having an interdigital length of about 100 μm, which is one half the interdigital length, i.e., about 200 μm, of the resonator SAW filter unit 500 of the comparative example. By reducing the interdigital length to one half, the characteristic impedance of each of the bandpass filters 1 and 2 becomes about 100Ω. The transmission characteristic with respect to the frequency and the reflection characteristic (input/output impedance characteristics standardized by the characteristic impedance) of each of the bandpass filters 1 and 2 are substantially the same as those of the resonator SAW filter unit 500 of the comparative example, except that the characteristic impedance is about 100Ω.

That is, the first and second bandpass filters 1 and 2 have a characteristic impedance of about 100Ω in a pass band of 1805 MHz to 1885 MHz.

The first bandpass filter 1 and the 90° phase shifter 4 are cascade-connected to define the filter circuit 7. The 90° phase shifter 5 and the second bandpass filter 2 are cascade-connected to define the filter circuit 8. By connecting the filter circuits 7 and 8 in parallel with each other, the above-described bandpass filter unit 200 is provided.

That is, the bandpass filter unit 200 of this example has a circuit configuration similar to that shown in FIG. 2.

Since the characteristic impedance of the filter circuits 7 and 8 is about 100Ω, the characteristic impedance of the bandpass filter unit 200 becomes about 50Ω.

Figure 6:
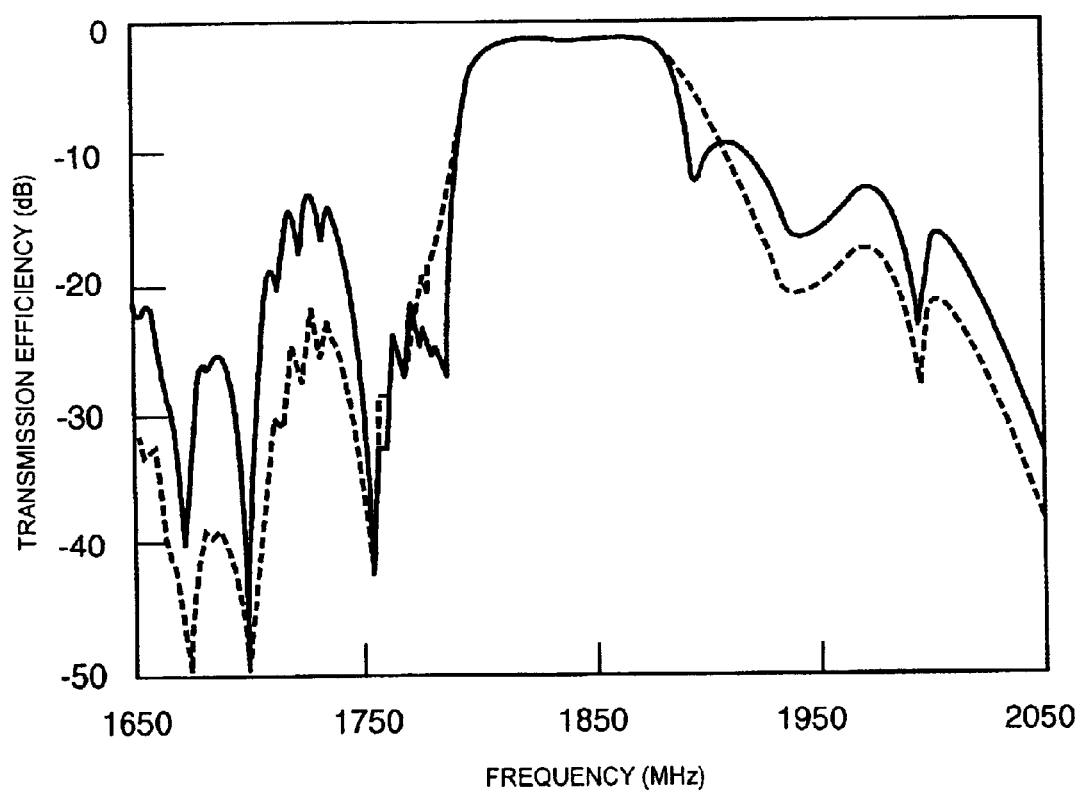
FIG. 6 illustrates the transmission efficiency with respect to the frequency of the bandpass filter unit shown in FIG. 4 and that of the resonator SAW filter unit of a comparative example.
Figure 7:
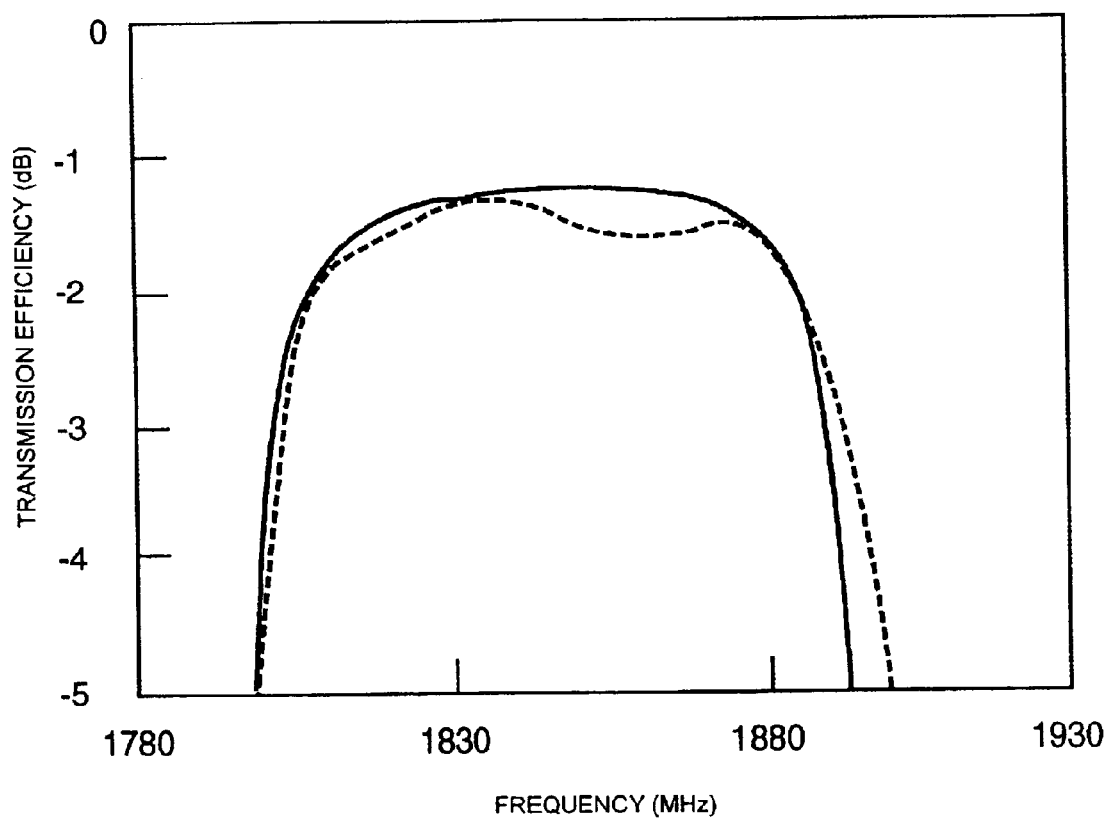
FIG. 7 illustrates an enlarged essential portion of the transmission efficiency shown in FIG. 6.
Figure 8:
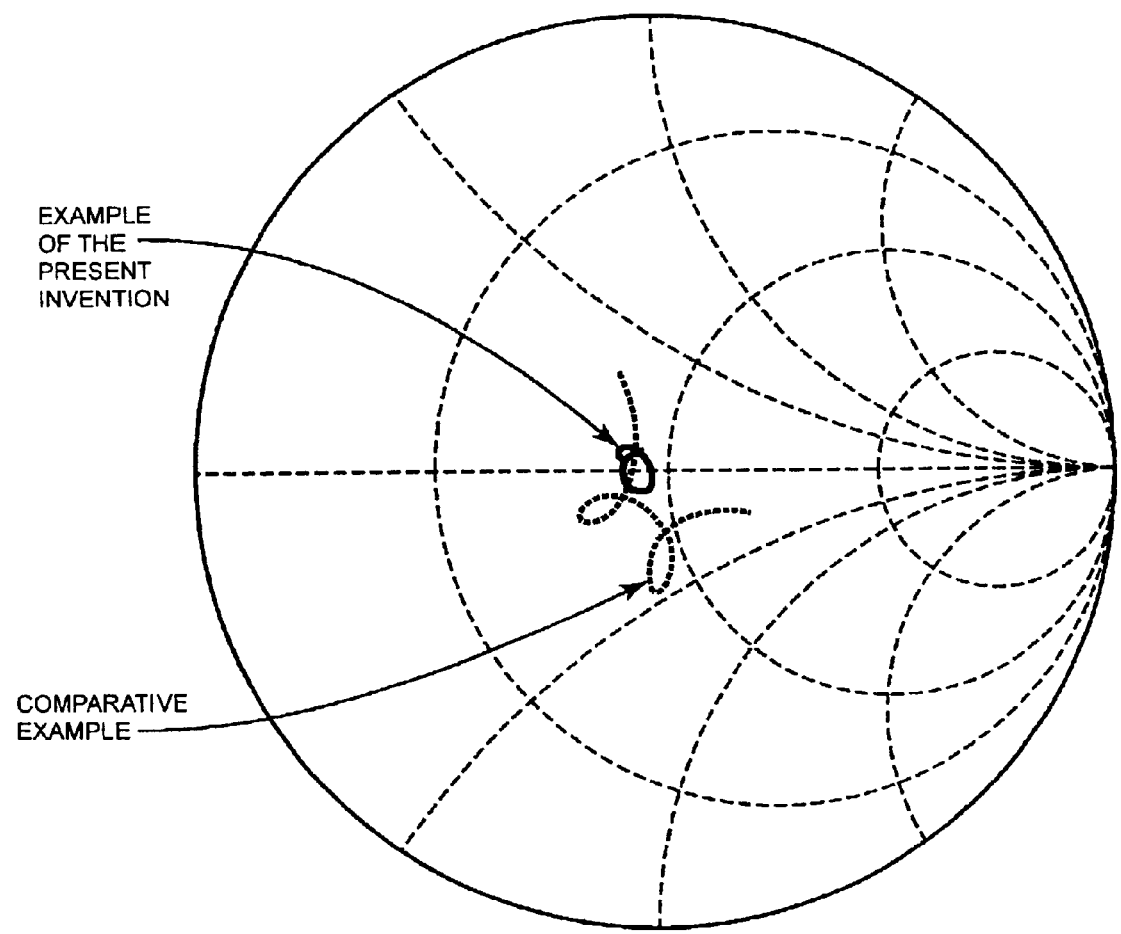
FIG. 8 is a Smith chart illustrating a pass-band impedance characteristic at the input terminal of the bandpass filter unit shown in FIG. 4 and that of the resonator SAW filter unit of the comparative example.
Figure 9:
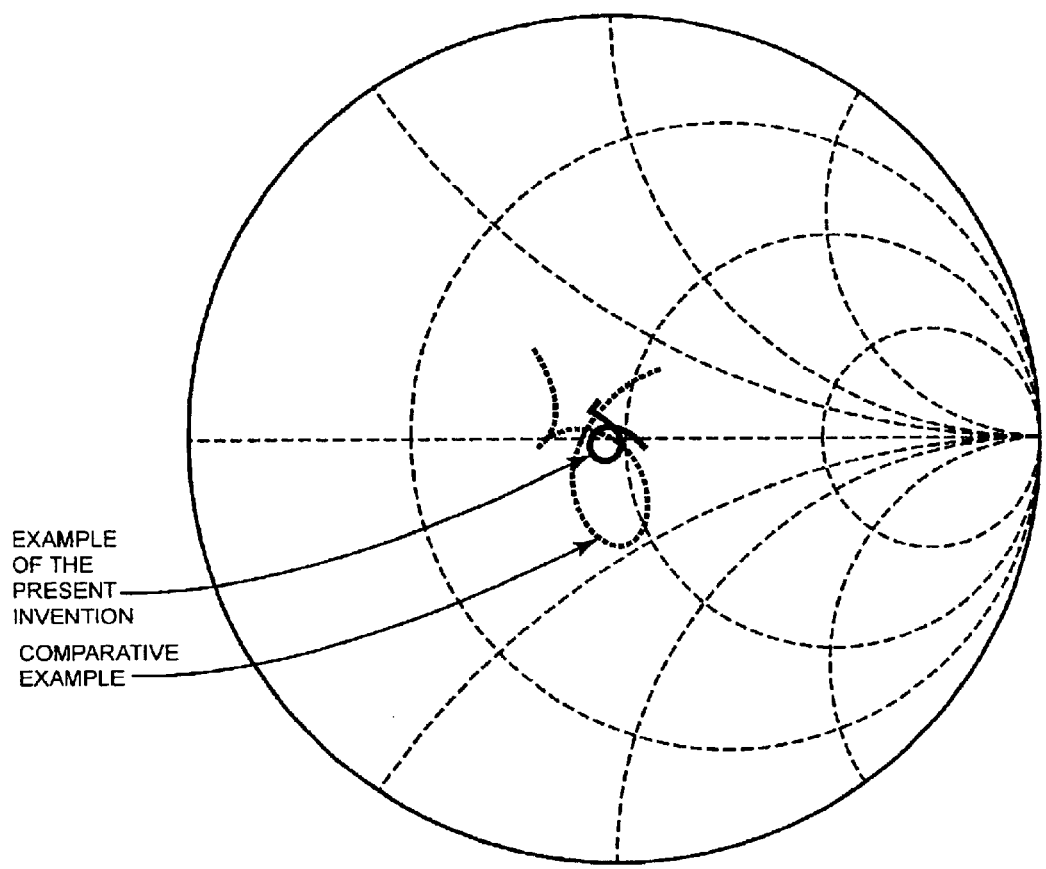
FIG. 9 is a Smith chart illustrating a pass-band impedance characteristic at the output terminal of the bandpass filter unit shown in FIG. 4 and that of the resonator SAW filter unit of the comparative example.

FIG. 6 illustrates the transmission characteristic of the bandpass filter unit 200 of this example and that of the resonator SAW filter unit 500 of the comparative example. FIG. 7 illustrates the enlarged essential portion of the transmission characteristic shown in FIG. 6. In FIGS. 6 and 7, the solid lines indicate the transmission characteristic of this example, and the broken lines indicate the transmission characteristic of the comparative example. FIGS. 8 and 9 are Smith charts illustrating the impedance characteristic of the input terminal and that of the output terminal in the pass band of 1805 MHz to 1885 MHz. In FIGS. 8 and 9, the solid lines indicate the impedance characteristic of this example, and the broken lines indicate the impedance characteristic of the comparative examples.

As shown in FIGS. 8 and 9, in the bandpass filter unit 200 of this example, the input/output impedances are closer to the perfect matching point, which is the center of the Smith charts, in the entire frequency range of the pass band, than the resonator SAW filter unit 500 of the comparative example. Accordingly, the bandpass filter unit 200 of this example exhibits a very good impedance matching characteristic.

The configurations of the bandpass filters 1 and 2 used in the bandpass filter unit 200 are substantially the same as those of the resonator SAW filter unit 500, except that the impedance is twice as high as that of the comparative example. Thus, an improvement in the impedance matching characteristic shown in FIGS. 8 and 9 is obtained by the configuration of preferred embodiments of the present invention, i.e., by a combination of the first and second bandpass filters 1 and 2 and the phase shifters.

FIGS. 6 and 7 show that the signal transmission efficiency of the bandpass filter unit 200 in the pass band is higher that that of the resonator SAW filter unit 500. This is probably because the signal loss is reduced due to a smaller amount of reflection of the pass-band signals at the input and output terminals. According to preferred embodiments of the present invention, therefore, not only the impedance matching at the input and output terminals is improved, but also, the loss is reduced.

In the aforementioned first preferred embodiment and the example thereof, the first and second bandpass filters 1 and 2 preferably have the same bandpass filter. However, they do not have to be the same. The characteristics of the bandpass filters 1 and 2 outside the pass band may be completely different as long as the characteristics in the pass band are substantially the same. If the difference in the transmission characteristic in the pass band between the bandpass filters 1 and 2 is not considerably large, the advantages of the present invention can still be obtained. Accordingly, it is only necessary that the pass-band transmission characteristics of the bandpass filters 1 and 2 substantially coincide with each other.

As a bandpass filter unit related to the present invention, a configuration in which a plurality of bandpass filters having different pass bands are connected in parallel with each other is known. However, in such a bandpass filter unit, an increase in the pass band is targeted by differentiating the pass bands of the bandpass filters. In contrast, according to the bandpass filter unit of preferred embodiments of the present invention, bandpass filters having the same pass band are connected in parallel with each other, and phase shift unit are connected to at least one of the bandpass filters in order to prevent an adverse influence at input and output terminals rather than to increase the pass band. Accordingly, it should be noted that the bandpass filter unit of preferred embodiments of the present invention is totally different from a known bandpass filter formed by connecting two bandpass filters having different pass bands in parallel with each other.

Additionally, in the bandpass filter unit of preferred embodiments of the present invention, the phase-shift amount generated at the upstream or downstream portion of the circuit must be differentiated from that in a known bandpass filter unit formed by connecting a plurality of bandpass filters having different bands in parallel with each other.

Preferably, in the bandpass filter unit 200, the length of the line from the input terminal pair 9 to the first bandpass filter 1 is substantially equal to that from the input terminal pair 9 to the second bandpass filter 2. Similarly, the length of the line from the first bandpass filter 1 to the output terminal pair 10 is preferably substantially equal to that from the second bandpass filter 2 to the output terminal pair 10. With this arrangement, the reflected waves from the two filter circuits 7 and 8 more reliably cancel each other out by the provision of the phase shifters.

Figure 10:
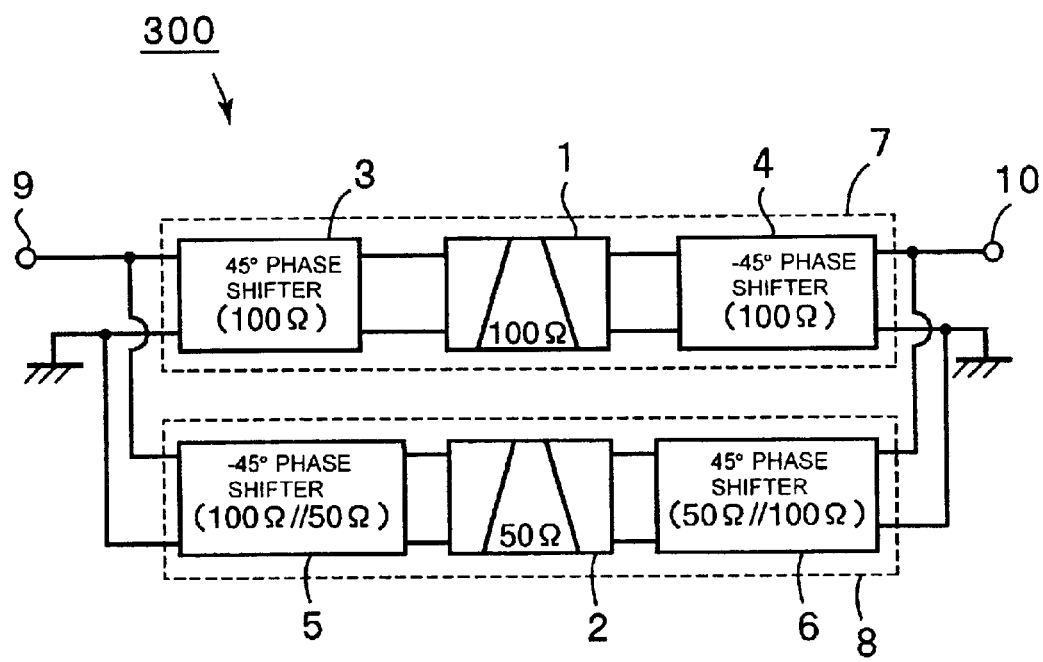
FIG. 10 is a circuit diagram illustrating a bandpass filter unit according to a second preferred embodiment of the present invention.

FIG. 10 illustrates the circuit configuration of a bandpass filter unit 300 according to a second preferred embodiment of the present invention. The bandpass filter unit 300 includes a first bandpass filter 1, a second bandpass filter 2, a 45° phase shifter 3, a −45° phase shifter 4, a −45° phase shifter 5, and a 45° phase shifter 6. The characteristic impedance of the bandpass filter 1 is about 100Ω, and the characteristic impedance of the bandpass filter 2 is about 50Ω. Except for the difference of the characteristic impedance, the bandpass filters 1 and 2 exhibit similar characteristics, such as the signal transmission efficiency with respect to the frequency and the reflection characteristic (input/output impedance characteristics standardized by the characteristic impedance).

By the use of SAW filters as the first and second bandpass filters 1 and 2, the characteristic impedances of the bandpass filters 1 and 2 can be easily differentiated as described above by setting the interdigital length of the bandpass filter 2 to be twice as long as that of the bandpass filter 1.

The phase shifters 3 through 6 are connected in a manner similar to those of the bandpass filter unit 100 shown in FIG. 1.

The characteristic impedances of the 45° phase shifter 3 and the −45° phase shifter 4 are about 100Ω. The characteristic impedances of the terminal of the −45° phase shifter 5 connected to the bandpass filter 2 is about 50Ω, and the characteristic impedance of the other terminal is about 100Ω. The characteristic impedance of the terminal of the 45° phase shifter 6 connected to the bandpass filter 2 is about 50Ω, and the characteristic impedance of the other terminal is about 100Ω.

With this configuration, the overall impedance of the bandpass filter unit 300 is about 50Ω. Accordingly, in the second preferred embodiment, the pass-band matching characteristic of the input/output impedances can also be improved.

More specifically, in the bandpass filter unit 300, the characteristic impedance of the bandpass filter 1 and that of the bandpass filter 2 are different, which apparently makes the pass-band characteristics of the bandpass filters 1 and 2 different. However, when the pass-band characteristics are standardized by the characteristic impedance, the transmission characteristic (frequency characteristic of the signal transmission efficiency) and the reflection characteristic (frequency characteristic of input/output impedances standardized by the characteristic impedance) are almost the same in the pass band. Accordingly, by providing the impedance conversion characteristic (transform characteristic) for the −45° phase shifter 5 and the 45° phase shifter 6 in the bandpass filter unit 300, the reflected waves occurring in the filter circuits 7 and 8 cancel each other out. It is thus possible to provide a bandpass filter unit having an improved pass-band matching characteristic of input/output impedances, as in the first preferred embodiment.

As discussed above, even if the characteristic impedance is different between the first and second bandpass filters 1 and 2, the present invention encompasses such bandpass filters 1 and 2 as long as the pass-band characteristics standardized by the characteristic impedance are substantially the same.

Not only in the above-described preferred embodiment, generally, even if the pass-band characteristics of two bandpass filters are apparently different, they can be corrected by phase shifters provided with a correction function, resulting in the bandpass filters exhibiting the substantially the same pass-band characteristics. Accordingly, reflected waves occurring in two filter circuits can cancel each other out in the almost entire frequency range of the pass band, thereby obtaining the advantages of the present invention.

Figure 11:
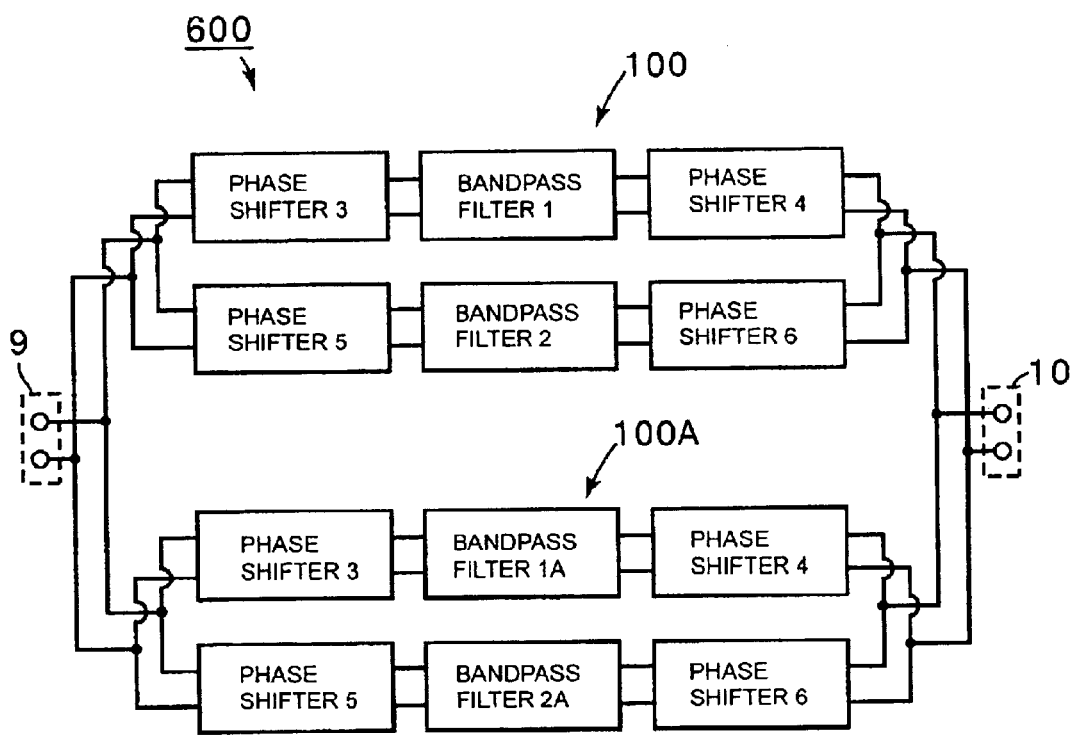
FIG. 11 is a circuit diagram illustrating still another modified example of the present invention.

FIG. 11 is a circuit diagram illustrating a bandpass filter unit 600 according to a modified example of preferred embodiments of the present invention. In the bandpass filter unit 600, the two bandpass filter units of the first preferred embodiment are connected in parallel with each other. That is, the bandpass filter unit 100 formed similar to the first preferred embodiment and a bandpass filter unit 100A formed substantially similar to the first preferred embodiment are connected in parallel with each other. The pass band of the bandpass filter unit 100 is different from that of the bandpass filter unit 100A. That is, the pass band of bandpass filters 1A and 2A used in the bandpass filter unit 100A are different from the bandpass filters 1 and 2 of the bandpass filter unit 100.

In the bandpass filter unit 600, the bandpass filter units 100 and 100A having different pass bands are connected in parallel with each other so as to increase the pass band by a combination of the pass bands of the two filter units 100 and 100A. Additionally, in each of the bandpass filter units 100 and 100A, the pass-band impedance matching characteristic at the input/output terminals is improved according to preferred embodiments of the present invention.

As described above, by connecting a plurality of the bandpass filter units of preferred embodiments of the present invention having different pass bands in parallel with each other, the impedance matching is greatly improved, and also, the pass band is significantly increased.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A bandpass filter unit comprising:

a first filter;

a second filter having a frequency characteristic at feast in a frequency band for use that is substantially identical to a frequency characteristic of said first filter, said second filter being connected in parallel with said first filter;

a first phase shift unit for shifting the phase by x degrees being cascade-connected to an input terminal of said first filter at a stage after parallel connecting points of the input terminal of said first filter and an input terminal of said second filter;

a second phase shift unit for shifting the phase by y degrees being cascade-connected to an output terminal of said first filter at a stage before parallel connecting points of the output terminal of said first filter and an output terminal of said second filter;

a third phase shift unit for shifting the phase by z degrees being cascade-connected to the input terminal of said second filter at a stage after the parallel connecting points of the input terminals of said first filter and said second filter; and a fourth phase shift unit for shifting the phase by w degrees being cascade-connected to the output terminal of said second filter at a stage before the parallel connecting points of the output terminals of said first filter and said second filter;

wherein x, y, z, and w substantially satisfy conditions expressed by equations (1) through (3):

(1) $2x-2z=180+n\times 360$ (n is a certain integer);

(2) $2y-2w=180+m\times 360$ (m is a certain integer); and (3) $x+y=z+w+l\times 360$ (l is a certain integer).

2. A bandpass filter unit according to claim 1, wherein at least one of said first, second, third and fourth phase shift units includes a delay line.

3. A bandpass filter unit according to claim 1, wherein at least one of said first, second, third and fourth phase shift units includes a capacitor device and an inductor device.

4. A bandpass filter unit according to claim 1, wherein at least one of said first filter and said second filter includes at least one of a surface acoustic wave filter, a dielectric filter and a piezoelectric filter.

5. A bandpass filter unit according to claim 1, wherein at least one of said first filter and said second filter comprises a surface acoustic wave filter including a piezoelectric substrate, and a delay line is defined by a conductor strip line disposed on the piezoelectric substrate.

6. A bandpass filter unit according to claim 1, wherein at least one of said first filter and said second filter comprises a surface acoustic wave filter including a piezoelectric substrate, and a capacitor device is defined by an opposing electrode disposed on the piezoelectric substrate.

7. A communication apparatus comprising the bandpass filter unit according to claim 1.

8. A bandpass filter unit comprising:

a first filter;

a second filter having a frequency characteristic at least in a frequency band for use that is substantially identical to a frequency characteristic of said first filter, said second filter being connected in parallel with said first filter;

a first phase shift unit for shifting the phase by substantially (90+n×180) degrees (n is a certain integer) being cascade-connected to an output terminal of said first filter at a stage before parallel connecting points of the output terminal of said first filter and an output terminal of said second filter; and a second phase shift unit for shifting the phase by substantially (90+m×180) degrees (m is a certain integer, which is an odd number when n is an odd number or is an even number when n is an even number), being cascade-connected to an input terminal of said second filter at a stage after parallel connecting points of an input terminal of said first filter and the input terminal of said second filter.

9. A bandpass filter unit according to claim 8, wherein at least one of said first and second phase shift units includes a delay line.

10. A bandpass filter unit according to claim 8, wherein at least one of said first and second phase shift units includes a capacitor device and an inductor device.

11. A bandpass filter unit according to claim 8, wherein at least one of said first filter and said second filter includes at least one of a surface acoustic wave filter, a dielectric filter, and a piezoelectric filter.

12. A bandpass filter unit according to claim 8, wherein at least one of said first filter and said second filter comprises a surface acoustic ware filter including a piezoelectric substrate, and a delay line is defined by a conductor strip line disposed on the piezoelectric substrate.

13. A bandpass filter unit according to claim 8, wherein at least one of said first filter and said second filter comprises a surface acoustic wave filter including a piezoelectric substrate, and a capacitor device is defined by an opposing electrode disposed on the piezoelectric substrate.

14. A communication apparatus comprising the bandpass filter unit according to claim 8.

15. A bandpass filter unit comprising:

a first filter;

a second filter having a frequency characteristic a least in a frequency band for use that is substantially identical to a frequency characteristic of said first filter, said second filter being connected in parallel with said first filter;

a first phase shift unit for shifting the phase by substantiality (90+n×180) degrees (n is a certain integer) being cascade-connected to an input terminal of said first filter at a stage after parallel connecting points of the input terminal of said first filter and an input terminal of said second filter; and a second phase shift unit for shifting the phase by substantially (90+m×180) degrees (m is a certain integer, which is an odd number when n is an odd number or is an even number when n is an even number) being cascade-connected to an output terminal of said first filter at a stage before parallel connecting points of the output terminal of said first filter and an output terminal of said second filter.

16. A bandpass filter unit according to claim 15, wherein at least one of said first and second phase shift units includes a delay line.

17. A bandpass filter unit according to claim 15, wherein at least one of said first and second phase shift units includes a capacitor device and an inductor device.

18. A bandpass filter unit according to claim 15, wherein at least one of said first filter and said second filter includes at least one of a surface acoustic wave filter, a dielectric filter, and a piezoelectric filter.

19. A bandpass filter unit according to claim 15, wherein at least one of said first filter and said second filter comprises a surface acoustic wave filter including a piezoelectric substrate, and a delay line is defined by a conductor strip line disposed on the piezoelectric substrate.

20. A bandpass filter unit according to claim 15, wherein at least one of said first filter and said second filter comprises a surface acoustic wave filter including a piezoelectric substrate, and a capacitor device is defined by an opposing electrode disposed on the piezoelectric substrate.

21. A communication apparatus comprising the bandpass filter unit according to claim 15.

* * * * *